United States Patent
Classen et al.

(10) Patent No.: US 8,901,679 B2
(45) Date of Patent: Dec. 2, 2014

(54) MICROMECHANICAL STRUCTURE, IN PARTICULAR SENSOR ARRANGEMENT, AND CORRESPONDING OPERATING METHOD

(71) Applicant: Robert Bosch GmbH, Stuttgart (DE)

(72) Inventors: Johannes Classen, Reutlingen (DE); Mirko Hattass, Stuttgart (DE); Lars Tebje, Reutlingen (DE); Daniel Christoph Meisel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/942,744

(22) Filed: Jul. 16, 2013

(65) Prior Publication Data
US 2014/0021515 A1 Jan. 23, 2014

(30) Foreign Application Priority Data
Jul. 17, 2012 (DE) .......................... 10 2012 212 445

(51) Int. Cl.
*H01L 21/48* (2006.01)
*B81B 7/00* (2006.01)
*B81C 1/00* (2006.01)
*G01P 15/08* (2006.01)

(52) U.S. Cl.
CPC ......... *B81B 7/008* (2013.01); *B81C 2203/0771* (2013.01); *B81C 2203/0735* (2013.01); *B81B 2201/0235* (2013.01); *B81C 1/00246* (2013.01); *B81C 2203/0792* (2013.01); *G01P 2015/0877* (2013.01)
USPC ........... 257/414; 257/415; 257/432; 257/444; 257/E21.499

(58) Field of Classification Search
CPC ...... H01L 24/24; H01L 24/82; H01L 27/0617
USPC .......................... 257/414–432, 444, E21.499
See application file for complete search history.

(56) References Cited

U.S. PATENT DOCUMENTS

| | | | | |
|---|---|---|---|---|
| 5,659,195 A | * | 8/1997 | Kaiser et al. | 257/415 |
| 6,249,001 B1 | * | 6/2001 | Sauer et al. | 250/338.1 |
| 7,057,246 B2 | * | 6/2006 | Reid | 257/417 |
| 7,057,251 B2 | * | 6/2006 | Reid | 257/432 |
| 2002/0047172 A1 | * | 4/2002 | Reid | 257/415 |
| 2003/0036215 A1 | * | 2/2003 | Reid | 438/52 |
| 2011/0027941 A1 | * | 2/2011 | Kumar et al. | 438/106 |

FOREIGN PATENT DOCUMENTS

DE 11 2006 000 131 T5 11/2007

* cited by examiner

*Primary Examiner* — Michael Lebentritt
(74) *Attorney, Agent, or Firm* — Maginot, Moore & Beck LLP

(57) ABSTRACT

A micromechanical structure, in particular a sensor arrangement, includes at least one micromechanical functional layer, a CMOS substrate region arranged below the at least one micromechanical functional layer, and an arrangement of one or more contact elements. The CMOS substrate region has at least one configurable circuit arrangement. The arrangement of one or more contact elements is arranged between the at least one micromechanical functional layer and the CMOS substrate region and is electrically connected to the micromechanical functional layer and the circuit arrangement. The configurable circuit arrangement is designed in such a way that the one or more contact elements are configured to be selectively connected to electrical connection lines in the CMOS substrate region.

11 Claims, 4 Drawing Sheets

A-A'

MICROMECHANICAL STRUCTURE, IN PARTICULAR SENSOR ARRANGEMENT, AND CORRESPONDING OPERATING METHOD

This application claims priority under 35 U.S.C. §119 to patent application no. DE 10 2012 212 445.4, filed on Jul. 17, 2012 in Germany, the disclosure of which is incorporated herein by reference in its entirety.

BACKGROUND

The present disclosure relates to a micromechanical structure, in particular a micromechanical sensor arrangement, and a corresponding operating method.

Micromechanical (or MEMS) structures, in particular sensor arrangements, such as inertial sensors, for example, are produced nowadays either as discrete sensors on dedicated chips or as integrated sensors together with an associated evaluation circuit. In the case of integrated sensors, there is either a vertical integration, wherein the sensor is arranged above the evaluation circuit, or a lateral integration, wherein the sensor is arranged alongside the evaluation circuit.

DE 11 2006 000 131 T5 discloses a micromechanical structure for forming an integrated spatial light modulator, wherein the micromechanical structure is constructed directly onto a CMOS evaluation circuit. The electrodes and the wiring thereof are defined during the production process, wherein the electrodes in the MEMS part are connected by means of through-contacts to the circuit parts in the CMOS wafer.

Defining the electrode configuration during the production process results in little flexibility for optimizing the latter toward the individuality of each chip or the operating situation thereof. The individuality of each chip results from the process tolerances, for example layer thickness differences between the center of the wafer and the edge region thereof, and also local process tolerances, e.g. different widths of adjacent structures within a chip. Alongside such geometric factors, there are also other influencing factors, such as e.g. surface charges. The operating situation can change as a result of temperature influences or ageing, for example, which likewise can only be partly compensated for by adapting voltages.

The location, the geometry and the task of the electrodes cannot subsequently be changed in the known production process. Only the applied voltages can be adapted to the process tolerances. As a result, unnecessary electrodes representing a dead area may be present, or the electrodes may be too small or too large for the available voltage levels, or the electrodes may be situated at a non-optimal location.

FIGS. 2a, b are schematic illustrations of an exemplary micromechanical structure, in particular sensor arrangement, specifically FIG. 2a in plan view, FIG. 2b in perpendicular cross section along the line A-A' in FIG. 2a.

In FIGS. 2a, b, reference sign 1 designates a micromechanical structure in the form of an acceleration sensor. The micromechanical structure 1 has a movable MEMS element 7 in a micromechanical functional plane 100, e.g. composed of polysilicon, which is anchored by means of spring elements 2 in the functional plane 100, electrical contact elements 3 in a contact plane 300 on conductor tracks 5 in a conductor track plane 500 on an insulation layer 600, e.g. composed of oxide, and via the latter in turn to a substrate 700, e.g. a wafer substrate. Via the conductor tracks 5 and the contact/electrodes 3, an electrical potential can be applied to the movable MEMS element 7.

Situated opposite the movable MEMS element 7 are immobile MEMS stator elements 4, which are likewise anchored by means of electrical contact elements 3 in the contact plane 300 on conductor tracks 5 in the conductor track plane 500 to the substrate 700, in the functional plane 100 as counterelectrodes, which are capacitively coupled to the movable MEMS element 7 by means of a comb structure K. Via the conductor tracks 5 and the contact elements 3, an electrical potential can be applied to the MEMS stator elements 7.

Further immobile MEMS elements 7a in the functional plane 100 in interspaces Z of the movable MEMS element 7 are connected by means of contact elements 3a to the conductor tracks 5 and, as described above, anchored to the substrate 700. Via the conductor tracks 5 and the contact elements 3a, an electrical potential can be applied to the immobile MEMS elements 7a.

By virtue of the contact elements 3 and 3a formed in this way, which are embedded for example into a sacrificial layer (not shown), and the conductor tracks 5 which lead to potential connections (likewise not illustrated), the electrode links are defined in an invariable fashion.

SUMMARY

The present disclosure provides a micromechanical structure, in particular a sensor arrangement, and a corresponding operating method.

The dependent claims relate to preferred developments.

The concept on which the present disclosure is based consists in the micromechanical structure, in particular sensor arrangement, being pervaded with a multiplicity of contact elements which can be embodied as electrodes, for example finger electrodes or columns of small design, and/or being surrounded, for example by substrate and top electrodes, wherein all or some of these electrodes are to be contact-connected separately with respect to the CMOS substrate region and the final interconnection of these electrodes is to be configured in a variable fashion only by a subsequent programming of a switching arrangement, for example of a gate array, in the CMOS wafer, as in the case of an FPGA, for example.

By virtue of the interconnection of the electrodes that is tailored for the individual chip in this way, the chip area is optimally utilized. Unnecessary compensation electrodes can be omitted or used for a different function. As a result, a further miniaturization and in association therewith a cost saving are possible with the performance remaining the same.

Furthermore, the electrode configuration in accordance with the operating method according to the disclosure can be adapted to the respective operating state, that is to say for example temperature and/or ageing effects or the like are compensated for.

In contrast to known electrode configurations, a small number of voltage levels can be employed and the number of electrodes connected in can be adapted instead. As a result, the circuit sections which generate the control or regulating voltages can be of less complex design.

In one preferred embodiment, a first micromechanical functional layer is provided, which has a movable MEMS element and MEMS stator elements (e.g. which can be capacitively coupled thereto), wherein the contact elements or electrodes are connected to the movable MEMS element and the MEMS stator elements. A capacitive oscillating device can thus be flexibly adjusted in terms of potential.

In a further preferred embodiment, the first micromechanical functional layer has one or a plurality of immobile first MEMS elements, wherein the movable MEMS element has one or a plurality of interspaces within which the immobile first MEMS element or elements is/are arranged and wherein the immobile first MEMS element or elements is/are in each case connected to the contact elements. Further electrodes which can be flexibly adjusted in terms of potential can thus be realized in a space-saving manner.

In a further preferred embodiment, a second micromechanical functional layer is provided, which is arranged below the first micromechanical functional layer, wherein the second micromechanical functional layer has one or a plurality of immobile second MEMS elements and wherein the immobile second MEMS element or elements is/are in each case connected to the contact elements. A further electrode plane can thus be realized in a space-saving manner.

In a further preferred embodiment, the immobile second MEMS element or elements is/are arranged below the movable MEMS element in a manner spaced apart therefrom. This affords a further possibility for flexibly adjusting a capacitive oscillating device in terms of potential.

In a further preferred embodiment, a substrate through-contact region is provided between the CMOS substrate region and the at least one micromechanical functional layer, above which substrate through-contact region first conductive connection regions are provided, to which the contact elements are connected, and wherein second conductive connection regions are led through the substrate through-contact region, said second conductive connection regions being connected to the first conductive connection regions to the circuit arrangement. It is thus possible to produce a robust electrical connection between the micromechanical functional layer and the CMOS substrate region.

In a further preferred embodiment, wherein the circuit arrangement has a gate array which is programmable via a control connection. It is thus possible to achieve simple and fast programming, e.g. via a bus connection.

In a further preferred embodiment, the micromechanical structure is embodied as an acceleration sensor. An accurate flexible potential adjustment is desired precisely in the case of such sensors.

BRIEF DESCRIPTION OF THE DRAWINGS

The present disclosure is explained in greater detail below on the basis of the exemplary embodiments indicated in the schematic figures of the drawings, in which:

FIGS. 1a-c show schematic illustrations of a micromechanical structure, in particular a sensor arrangement, in accordance with one embodiment of the present disclosure, specifically FIG. 1a in plan view and FIG. 1b in perpendicular cross section along the line A-A' in FIG. 1a, and FIG. 1c in perpendicular cross section along the line B-B' in FIG. 1a; and FIGS. 2a, b show schematic illustrations of an exemplary micromechanical structure, in particular a sensor arrangement, specifically FIG. 2a in plan view and FIG. 2b in perpendicular cross section along the line A-A' in FIG. 2a.

DETAILED DESCRIPTION

Figure 1A:
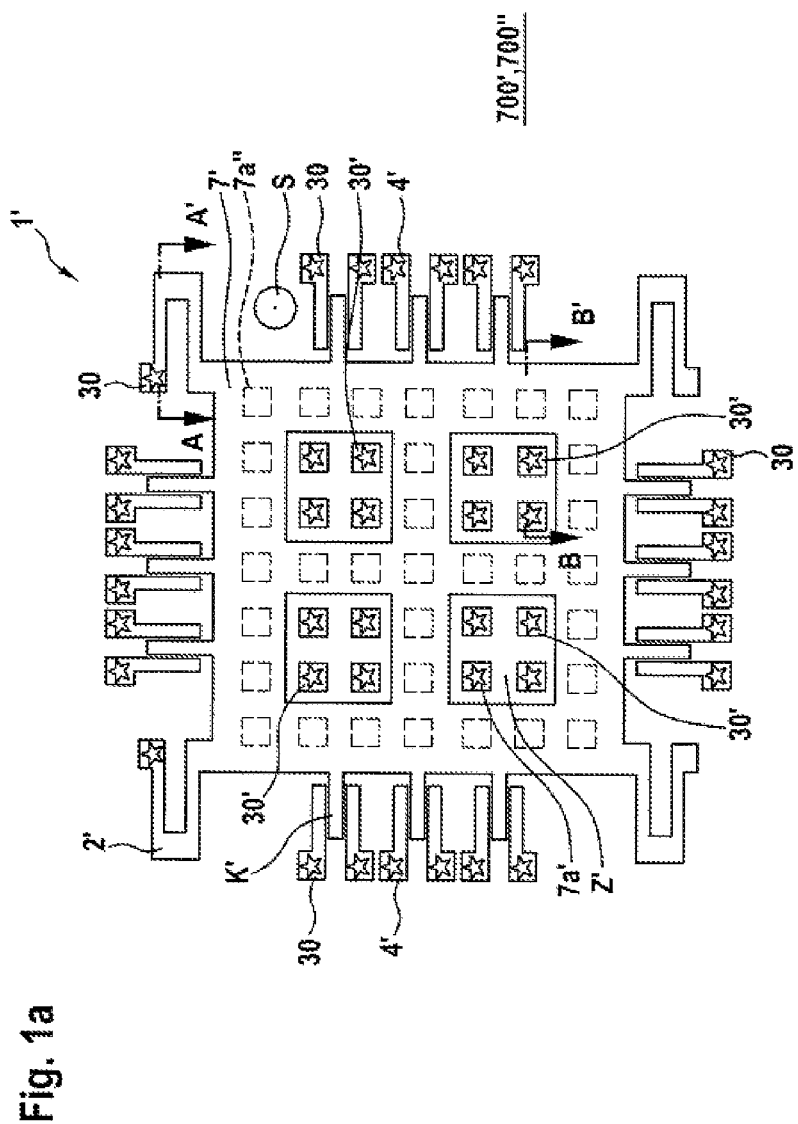
Figure 1B:
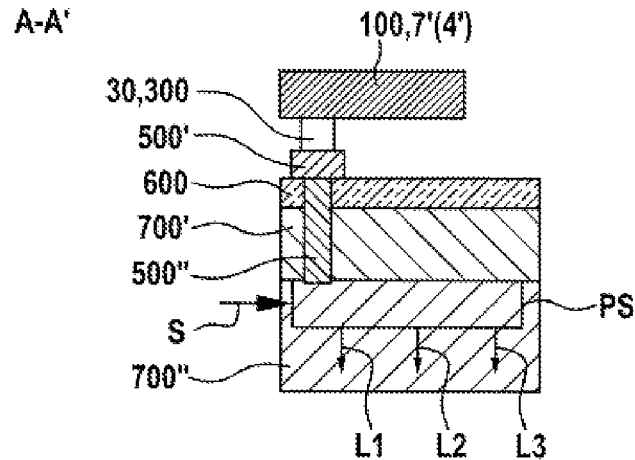
Figure 1C:
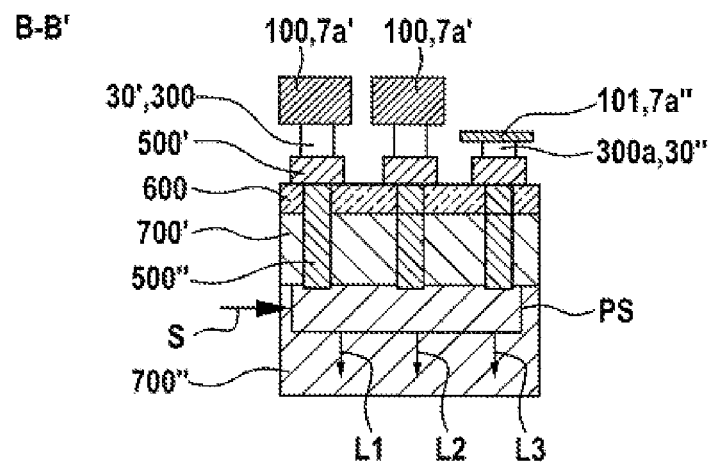
Figure 2A:
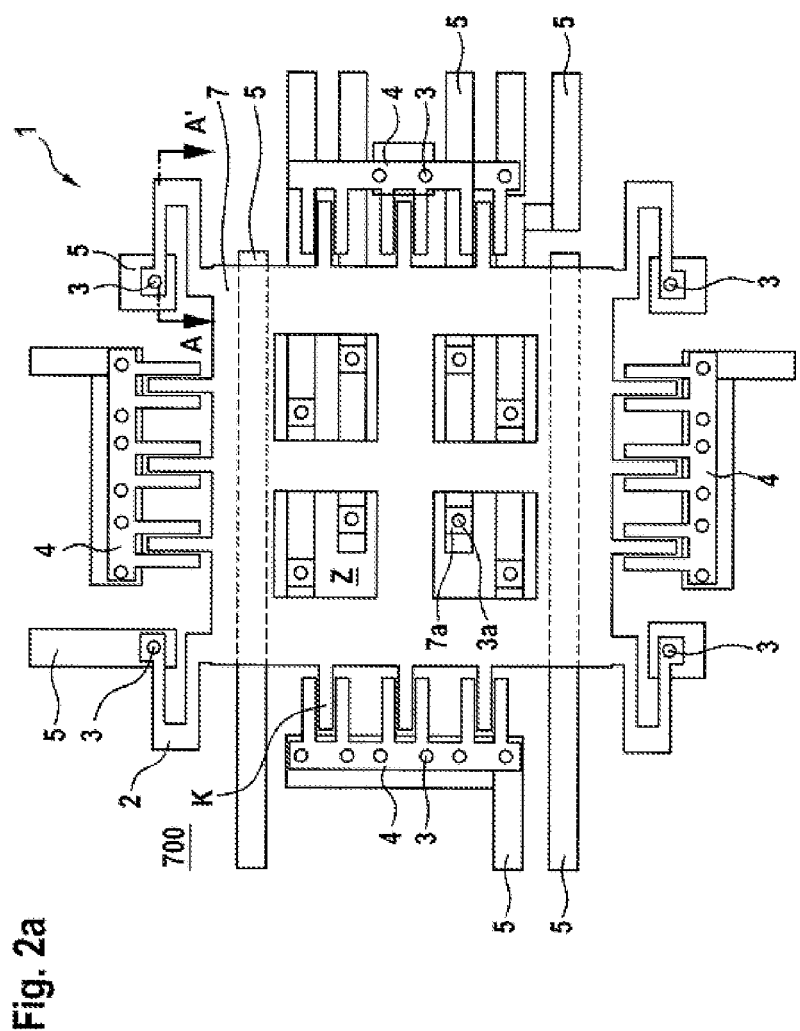
Figure 2B:
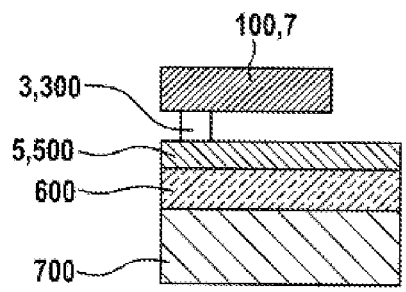

FIGS. 1a-c are schematic illustrations of a micromechanical structure, in particular sensor arrangement, in accordance with one embodiment of the present disclosure, specifically FIG. 1a in plan view and FIG. 1b in perpendicular cross section along the line A-A' in FIG. 1a, and FIG. 1c in perpendicular cross section along the line B-B' in FIG. 1a.

In FIGS. 1a-c, reference sign 1' designates a micromechanical structure in the form of an acceleration sensor. The micromechanical structure 1' has a movable MEMS element 7' in a micromechanical functional plane 100, e.g. composed of polysilicon, which is anchored by means of spring elements 2' in the functional plane 100 and reconfigurable electrical contact elements 30, which can be embodied as electrodes 30, in a contact plane 300 on a substrate 700', 700". In this case, the substrate comprises a lower CMOS substrate region 700" and an upper substrate through-contact region 700'.

Via the reconfigurable contact elements 30, a variable electrical potential can be applied to the movable MEMS element 7'.

Situated opposite the movable MEMS element 7' are immobile MEMS stator elements 4', which are likewise anchored by means of electrical contact elements 30 in the contact plane 300 on the substrate 700', 700", in the functional plane 100 as counterelectrodes, which are capacitively coupled to the movable MEMS element 7' by means of a comb structure K'. The MEMS stator elements 4' are likewise anchored by means of reconfigurable electrical contact elements 30 in the contact plane 300 on the substrate 700', 700".

Via the reconfigurable contact elements 30, a variable electrical potential can be applied to the MEMS stator elements 4'.

Further immobile MEMS elements 7a' in the functional plane 100 in interspaces Z' of the movable MEMS element 7' are anchored by means of analogous reconfigurable contact elements 30' or electrodes 30' to the substrate 700', 700".

Via the reconfigurable contact elements 30', a variable electrical potential can be applied to the further immobile MEMS elements 7a' in the interspaces Z of the movable MEMS element 7'.

Further immovable MEMS elements 7a" in a more deeply situated functional plane 101 below the movable MEMS element 7' are anchored by means of analogous reconfigurable contact elements 30" or electrodes 30" in a more deeply situated contact plane 300a to the substrate 700', 700".

These further immobile elements can also be implemented directly in the plane 500', that is to say with omission of the planes 101 and 300a.

Via the reconfigurable contact elements 30", a variable electrical potential can be applied to the further immobile MEMS elements 7a" in the more deeply situated functional plane 101 below the movable MEMS element 7'.

The reconfigurable contact elements 30, 30', 30" or reconfigurable electrodes 30, 30', 30" are explained in greater detail below with reference to FIGS. 1b, c.

As can be gathered from FIG. 1b, the movable MEMS element 7' and the MEMS stator elements 4' are connected to a circuit arrangement PS in the CMOS substrate region 700" via the reconfigurable contact elements 30 and via conductive regions 500', 500" situated underneath.

As can be gathered from FIG. 1c, the further immobile MEMS elements 7a' in the functional plane 100 in interspaces Z of the movable MEMS element 7' are connected to the circuit arrangement PS in the CMOS substrate region 700" via the analogous reconfigurable contact elements 30' and via the conductive regions 500', 500" situated underneath.

As can likewise be gathered from FIG. 1c, the further immobile MEMS elements 7a" in the more deeply situated functional plane 101 below the movable MEMS element 7' are connected to the circuit arrangement PS in the CMOS substrate region 700" via the analogous reconfigurable contact elements 30" and via the first and second conductive connection regions 500', 500" situated underneath.

In particular, the reconfigurable contact elements 30, 30', 30" are led onto the first conductive connection regions 500', which are applied on an insulation layer 600, e.g. oxide, which is situated on the substrate through-contact region 700'.

The planar first conductive connection regions 500' are is connected via the plug-like second conductive connection regions 500", which are led through the insulation layer 600 and the substrate through-contact region 700', to the circuit arrangement PS arranged in the CMOS substrate region 700".

The circuit arrangement PS makes it possible, via a control connection S, e.g. a bus connection, to connect the reconfigurable contact elements 30, 30', 30" optionally to internal CMOS conductor tracks L1, L2, L3 and it can thus be configured freely or connected freely to predefined potentials.

Via the freely configurable contact elements 30, 30', 50, the various elements 4', 7', 7a', 7a" of the micromechanical structure can thus be connected to predefined potentials in a freely configurable manner.

Although the present disclosure has been described fully above on the basis of preferred exemplary embodiments, it is not restricted thereto, but rather can be modified in diverse ways.

In particular, the disclosure is not restricted to the sensors indicated by way of example.

What is claimed is:

1. A micromechanical structure, comprising:
   at least one micromechanical functional layer;
   a CMOS substrate region arranged below the at least one micromechanical functional layer, the CMOS substrate region having at least one configurable circuit arrangement; and
   an arrangement of one or more contact elements, said arrangement being arranged between the at least one micromechanical functional layer and the CMOS substrate region and being electrically connected to the micromechanical functional layer and the circuit arrangement,
   wherein the configurable circuit arrangement is designed in such a way that the one or more contact elements are configured to be selectively connected to electrical connection lines in the CMOS substrate region.

2. The micromechanical structure according to claim 1, further comprising a first micromechanical functional layer having a movable MEMS element and MEMS stator elements, the contact elements being connected to one or more of the movable MEMS element and the MEMS stator elements.

3. The micromechanical structure according to claim 2, wherein the first micromechanical functional layer has one or more immobile first MEMS elements, wherein the movable MEMS element has one or more interspaces within which the one or more immobile first MEMS elements are arranged, and wherein the one or more immobile first MEMS elements are each connected to the contact elements.

4. The micromechanical structure according to claim 3, further comprising a second micromechanical functional layer arranged below the first micromechanical functional layer, the second micromechanical functional layer having one or more immobile second MEMS elements respectively connected to the contact elements.

5. The micromechanical structure according to claim 4, wherein the one or more immobile second MEMS elements are arranged below the movable MEMS element in a manner spaced apart therefrom.

6. The micromechanical structure according to claim 1, further comprising:
   a substrate through-contact region provided between the CMOS substrate region and the at least one micromechanical functional layer;
   first conductive connection regions provided above the substrate through-contact region, the contact elements being connected to the first conductive connection regions; and
   second conductive connection regions led through the substrate through-contact regions, the second conductive connection regions being connected to the first conductive connection regions to the circuit arrangement.

7. The micromechanical structure according to claim 1, wherein the circuit arrangement has a gate array that is programmable via a control connection.

8. The micromechanical structure according to claim 1, wherein the micromechanical structure is embodied as an acceleration sensor or as a rate-of-rotation sensor.

9. The micromechanical structure according to claim 1, wherein the circuit arrangement is reprogrammable to counteract one or more of aging effects and ambient effects.

10. The micromechanical structure according to claim 9, wherein the ambient effects are temperature effects.

11. The micromechanical structure according to claim 1, wherein the micromechanical structure is a sensor arrangement.

* * * * *